(12) United States Patent
Potter et al.

(10) Patent No.: US 10,794,681 B2
(45) Date of Patent: Oct. 6, 2020

(54) LONG RANGE CAPACITIVE GAP MEASUREMENT IN A WAFER FORM SENSOR SYSTEM

(71) Applicant: APPLIED MATERIALS, INC., Santa Clara, CA (US)

(72) Inventors: Charles G. Potter, Santa Clara, CA (US); Eli Mor, Garden City, ID (US)

(73) Assignee: Applied Materials, Inc., Santa Clara, CA (US)

( * ) Notice: Subject to any disclaimer, the term of this patent is extended or adjusted under 35 U.S.C. 154(b) by 86 days.

(21) Appl. No.: 16/121,191

(22) Filed: Sep. 4, 2018

(65) Prior Publication Data

US 2020/0072594 A1   Mar. 5, 2020

(51) Int. Cl.
*G01R 27/26* (2006.01)
*G01B 7/14* (2006.01)
(Continued)

(52) U.S. Cl.
CPC .............. *G01B 7/14* (2013.01); *G01B 7/003* (2013.01); *G01B 7/023* (2013.01); *G01B 7/08* (2013.01); *G01B 7/087* (2013.01); *H01J 37/32807* (2013.01); *B65H 2220/03* (2013.01); *B65H 2511/13* (2013.01); *B65H 2511/162* (2013.01); *B65H 2515/712* (2013.01); *H01J 2237/2446* (2013.01); *H01J 2237/24578* (2013.01)

(58) Field of Classification Search
CPC ............ B65H 2220/03; B65H 2511/13; B65H 2511/162; B65H 2515/712; G01B 7/08; G01B 7/023; G01B 7/087

USPC .......... 324/76.11–76.83, 459, 600, 635, 644, 324/649, 658, 662, 663, 671, 716
See application file for complete search history.

(56) References Cited

U.S. PATENT DOCUMENTS 6,499,367 B1   12/2002  Saeki
7,778,793 B2   8/2010   Bonciolini et al.
(Continued)

FOREIGN PATENT DOCUMENTS

EP   1669808 A2   6/2007
JP   4956328 B2   6/2012
(Continued)

OTHER PUBLICATIONS

International Search Report and Written Opinion from PCT/US2019/044755 dated Nov. 20, 2019, 13 pgs.
(Continued)

*Primary Examiner* — Raul J Rios Russo
(74) *Attorney, Agent, or Firm* — Schwabe Williamson & Wyatt

(57) ABSTRACT

Embodiments disclosed herein include a sensor wafer. In an embodiment, the sensor wafer comprises a substrate, wherein the substrate comprises a first surface and a second surface opposite the first surface. In an embodiment, the sensor wafer further comprises a first conductive pad with a first surface area, wherein the first conductive pad has a surface that is substantially coplanar with the first surface of the substrate. In an embodiment, the sensor wafer further comprises a second conductive pad with a second surface area that is smaller than the first surface area, wherein the second conductive pad has a surface that is substantially coplanar with the first surface of the substrate.

19 Claims, 5 Drawing Sheets

(51) Int. Cl.
  *H01J 37/32* (2006.01)
  *G01B 7/00* (2006.01)
  *G01B 7/06* (2006.01)
  *G01B 7/02* (2006.01)

(56) References Cited

U.S. PATENT DOCUMENTS

| | | | |
|---|---|---|---|
| 7,804,306 B2 | 9/2010 | Gardner et al. | |
| 9,903,739 B2 | 2/2018 | Sugita et al. | |
| 2003/0227624 A1* | 12/2003 | Wu | G03F 7/7075 356/400 |
| 2007/0046284 A1 | 3/2007 | Renken et al. | |
| 2007/0222462 A1 | 9/2007 | Gardner et al. | |
| 2008/0231291 A1 | 9/2008 | Ramsey et al. | |
| 2008/0246493 A1 | 10/2008 | Gardner | |
| 2009/0001616 A1* | 1/2009 | Bonora | H01L 21/67282 257/797 |
| 2011/0074341 A1 | 3/2011 | Jensen et al. | |
| 2011/0193573 A1 | 8/2011 | De Boer et al. | |
| 2012/0304928 A1 | 12/2012 | Koelmel et al. | |
| 2013/0029433 A1 | 1/2013 | Sun et al. | |
| 2015/0369583 A1* | 12/2015 | Potter, Sr. | H01L 21/67259 702/150 |
| 2016/0141154 A1 | 5/2016 | Kamata et al. | |
| 2016/0211166 A1 | 7/2016 | Yan et al. | |
| 2016/0220172 A1 | 8/2016 | Sarrafzadeh et al. | |
| 2016/0363433 A1 | 12/2016 | Sugita et al. | |
| 2017/0012021 A1* | 1/2017 | Uzoh | H01L 23/49816 |
| 2017/0131217 A1 | 5/2017 | Tedeschi et al. | |
| 2018/0114681 A1 | 4/2018 | Jensen et al. | |
| 2018/0218998 A1* | 8/2018 | Uzoh | H01L 24/80 |
| 2018/0240694 A1 | 8/2018 | Adderly et al. | |
| 2020/0058611 A1* | 2/2020 | Lin | H01L 23/3171 |

FOREIGN PATENT DOCUMENTS

| | | |
|---|---|---|
| JP | 2017003557 A | 1/2017 |
| JP | 2017-228754 | 12/2017 |
| KR | 1020170014384 A | 2/2017 |
| KR | 101841607 B1 | 3/2018 |

OTHER PUBLICATIONS

International Search Report and Written Opinion from PCT/US2019/047535 dated Dec. 10, 2019, 10 pgs.
International Search Report and Written Opinion from PCT/US2019/047752 dated Dec. 10, 2019, 12 pgs.
International Search Report and Written Opinion from PCT/US2019/047983 dated Dec. 13, 2019, 12 pgs.
International Search Report and the Written Opinion from PCT/US2019/044524 dated Dec. 20, 2019, 10 pgs.

* cited by examiner

US 10,794,681 B2

LONG RANGE CAPACITIVE GAP MEASUREMENT IN A WAFER FORM SENSOR SYSTEM

BACKGROUND

1) Field

Embodiments relate to the field of semiconductor manufacturing and, in particular, to methods and apparatuses for measuring gaps in semiconductor manufacturing environments with a capacitive sensor system.

2) Description of Related Art

In semiconductor manufacturing, process uniformity over an entire substrate is critical to provide high yields. In plasma processes the relationship of the electrode (e.g., a showerhead or gas distribution pad) opposing the substrate needs to have highly accurate spacing and parallelism. Typically, the gap distance between the substrate and the electrode is greater than 1 inch.

However, currently available measurement tools, such as capacitive sensors, have a maximum range that is only between approximately 0.25 inches and 0.75 inches. As such, additional hardware must be used to bring the sensors closer to the electrode. The use of additional hardware prevents the sensors from being able to be removed from the processing chamber without also needing to vent the chamber after the calibration is completed. Accordingly, equipment down-time for calibration is increased. Additionally, the calibration may not be as accurate since the chamber needs to be vented and pumped back down after removal of the calibration equipment.

SUMMARY

Embodiments disclosed herein include a sensor wafer. In an embodiment, the sensor wafer comprises a substrate, wherein the substrate comprises a first surface and a second surface opposite the first surface. In an embodiment, the sensor wafer further comprises a first conductive pad with a first surface area, wherein the first conductive pad has a surface that is substantially coplanar with the first surface of the substrate. In an embodiment, the sensor wafer further comprises a second conductive pad with a second surface area that is smaller than the first surface area, wherein the second conductive pad has a surface that is substantially coplanar with the first surface of the substrate.

Embodiments disclosed herein may also include a method for measuring a gap between a showerhead and a support surface in a processing chamber. In an embodiment, the method comprises pumping down a processing chamber, wherein the processing chamber comprises a support surface and a showerhead opposing the support surface. In an embodiment, the method may further comprise placing a sensor wafer on the support surface, wherein the sensor wafer comprises a first conductive pad with a first surface area and a second conductive pad with a second surface area that is smaller than the first surface area. In an embodiment, the method may further comprise measuring a gap between the sensor wafer and the showerhead with the first conductive pad and the second conductive pad. In an embodiment, the method may further comprise removing the sensor wafer from the processing chamber without venting the processing chamber.

Embodiments disclosed herein may also comprise a sensor wafer that comprises a substrate, wherein the substrate comprises a first surface and a second surface opposite the first surface. In an embodiment, the sensor wafer may further comprise a plurality of first conductive pads with a first surface area, wherein the first conductive pads have surfaces that are substantially coplanar with the first surface of the substrate. In an embodiment, the sensor wafer may further comprise a plurality of second conductive pads with a second surface area that is smaller than the first surface area, wherein the second conductive pads have surfaces that are substantially coplanar with the first surface of the substrate, and wherein the first conductive pads and second conductive pads are arranged radially around the substrate in an alternating pattern. In an embodiment, the sensor wafer may further comprise a control module embedded in the substrate, wherein the control module comprises circuitry for sensing a distance between the first surface of the substrate and a surface external to the sensor wafer opposing the first surface using the first conductive pads and the second conductive pads.

DETAILED DESCRIPTION

Systems that include sensor wafers with top facing capacitive sensors and methods of using such sensor wafers to measure gaps in a semiconductor manufacturing environment are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, currently available sensor technologies do not provide the desired range (e.g., greater than 1 inch) needed to accurately measure the gap between a support surface (e.g., an electrostatic chuck (ESC)) and an opposing surface (e.g., a showerhead or gas distribution pad) in a semiconductor processing chamber. Accordingly, embodiments disclosed herein comprise a sensor wafer with capacitive sensing electrodes that have a sensing range that is greater than 1 inch. By integrating such a long range capacitive sensing apparatus in the form-factor of a wafer, the sensor wafer is able to implement calibrations in a chamber without subsequently needing to vent the chamber. Therefore, embodiments disclosed herein allow for shorter calibration times and increases the throughput capacity of the processing chamber. Additionally, embodiments disclosed herein allow for parallelism measurements and improved accuracy of calibration measurements.

Figure 1:
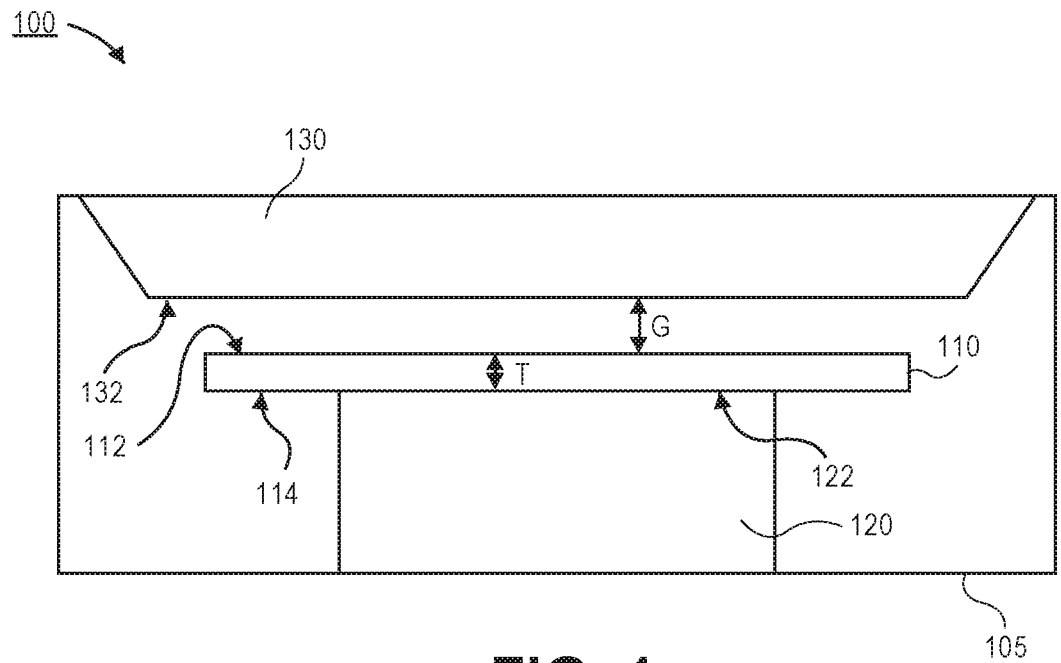
FIG. 1 is a cross-sectional schematic illustration of a processing chamber with a sensor wafer for measuring a gap between a showerhead and a support surface, in accordance with an embodiment.

Referring now to FIG. 1, a cross-sectional illustration of a processing tool 100 is shown, in accordance with an embodiment. In an embodiment, the processing tool 100 may comprise a chamber 105 (e.g., a vacuum chamber). A vacuum pump (not shown) may be fluidically coupled to the chamber 105 to provide a less than atmospheric pressure within the chamber 105 during operation. In an embodiment, the processing tool 100 may comprise a support surface 120 for supporting substrates in the chamber 105. The support surface 120 may be an ESC or any other suitable surface for securing and supporting substrates. In an embodiment, the processing tool 100 may comprise a showerhead (also referred to as a gas distribution plate) 130 that opposes the support surface 120. One or more processing gasses may be flown into the chamber 110 through the showerhead 130. The showerhead 130 may also function as one of the electrodes in a plasma processing tool.

While several particular components of the processing tool 100 are explicitly shown, it is to be appreciated that any number of additional components common to processing tools in the semiconductor manufacturing field may also be included in the processing tool 100, as those skilled in the art will recognize. In an embodiment, the processing tool 100 may be a plasma processing tool (e.g., a plasma etch tool, a physical vapor deposition (PVD) tool, a plasma enhanced chemical vapor deposition (PE-CVD) tool, a plasma enhanced atomic layer deposition (PE-ALD) tool, or the like). Embodiments may also include processing tools 100 that are not plasma based tools (e.g., CVD, ALD, furnaces, etc.).

In an embodiment, the position of the surface 122 of the support surface 120 relative to the surface 132 of the showerhead 130 may be measured with a sensor wafer 110. In an embodiment, the sensor wafer 110 has substantially the same form-factor as substrates that are processed in the processing tool 100. For example, the sensor wafer 110 may have a diameter that is 300 mm. A sensor wafer 110 that has a form-factor that is substantially similar to the form-factor of the substrates allows for the processing tool 100 to be calibrated without a subsequent venting. For example, the wafer handling robot of a processing tool 100 may move the sensor wafer 110 within the processing tool, and the sensor wafer 110 may fit through load locks of the processing tool 100. In an embodiment, the sensor wafer 110 may comprise a first surface 112 that opposes the surface 132 of the showerhead 130 and a second surface 114 that is supported by surface 122 of the support surface 120.

In an embodiment, the sensor wafer 110 may comprise a plurality of capacitive sensors (described and shown in greater detail below) that provide a measurement of a gap G between the surface 132 of the showerhead 130 and the first surface 112 of the sensor wafer 110. Since the thickness T of the sensor wafer 110 is known, the total gap distance between surface 132 of the showerhead 130 and surface 122 of the support surface 120 may be accurately measured by the sensor wafer 110. Furthermore, by providing a plurality of gap readings across the sensor wafer 110, a parallelism measurement between the showerhead 130 and the support surface 120 may be made in accordance with some embodiments.

Figure 2A:
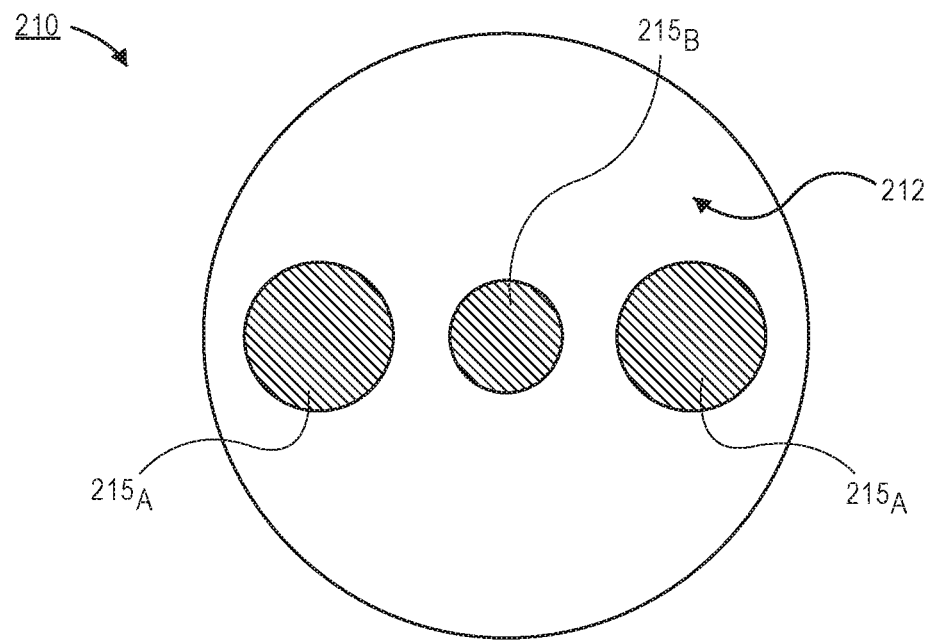
FIG. 2A is a plan view illustration of a sensor wafer with a plurality of conductive pads with first conductive pads having a larger surface area than a second conductive pad, in accordance with an embodiment.
Figure 2B:
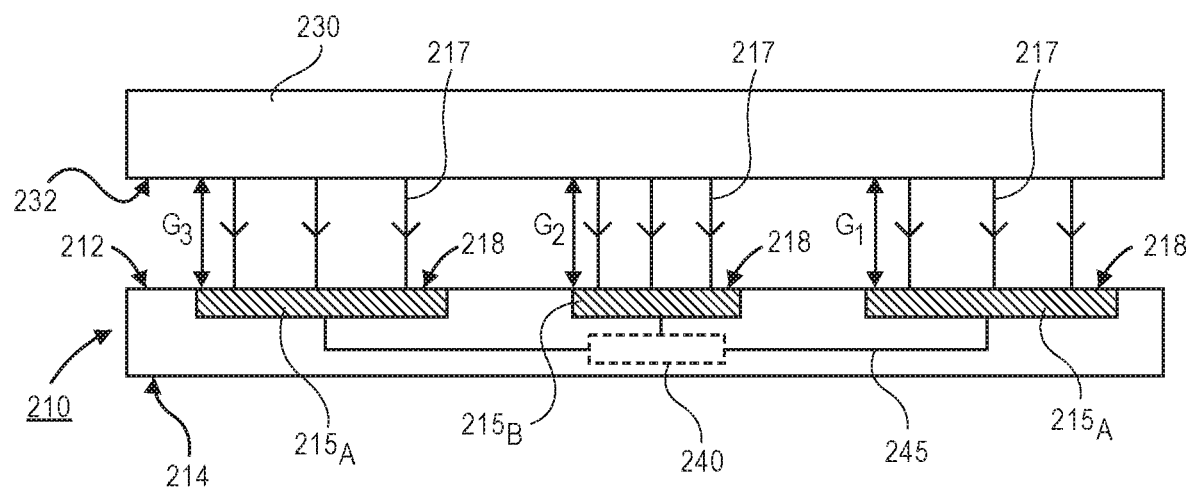
FIG. 2B is a cross-sectional illustration of a sensor wafer that illustrates the electric field lines between the first conductive pads and the second conductive pad, in accordance with an embodiment.

Referring now to FIGS. 2A and 2B, a plan view illustration and corresponding cross-sectional illustration of a sensor wafer 210 is shown, in accordance with an embodiment. In an embodiment, the sensor wafer 210 may comprise a plurality of conductive pads 215 arranged across the first surface 212. As shown in FIG. 2B, the conductive pads 215 may be embedded in the sensor wafer 210 and have surfaces 218 that are substantially coplanar with the first surface 212 of the sensor wafer 210. The conductive pads 215 may be spaced away from a showerhead surface 232 by a gap G.

In an embodiment, the conductive pads 215 may be electrically coupled to a control module 240 by traces 245. The control module 240 may include circuitry for supplying current to the conductive pads 215. In an embodiment, the conductive pads 215 may comprise first conductive pads $215_A$ and a second conductive pad $215e$. In an embodiment, the current supplied to the first conductive pads $215_A$ has an output phase that is 180 degrees offset from an output phase of current supplied to the second conductive pad $215_B$. In an embodiment, the amount of current supplied to the first conductive pads $215_A$ may be different than the amount of current supplied to the second conductive pads $215_B$. For example, the amount of current supplied to a conductive pad 215 may be proportional to the surface area of the conductive pad 215. For example, large conductive pads (e.g., first conductive pads $215_A$) may be supplied with a greater amount of current than small conductive pads (e.g., the second conductive pad $215_B$). In an embodiment, the amount of current supplied to each conductive pad 215 is held substantially constant. In an embodiment, the amount of current supplied to the conductive pads may be between 0.1 µA and 1.0 µA.

In an embodiment, each of the conductive pads 215 may form one electrode of a capacitor. The opposing surface (e.g., a showerhead surface 232) may form the other electrode of the capacitor for each of the conductive pads 215. Since the first conductive pads $215_A$ and the second conductive pads $215_B$ are supplied with current that is 180 degrees out of phase, the opposing surface (e.g., the showerhead surface 232) does not need to be grounded, and the plurality of conductive pads $215_A$ and $215_B$ may be referred to as self-referencing.

In an embodiment, as the showerhead surface 232 is brought into proximity with the sensor wafer 210, the electric field 217 is modified. Depending on how the electric field is modified, a change in the voltage for each of the first conductive pads $215_A$ and the second conductive pad $215_B$ may be sensed by the control module 240. Due to the differences in the amount of current and the surface area of the first conductive pads $215_A$ and the second conductive pad $215_B$, the measured voltage of the first conductive pads $215_A$ and the second conductive pad $215_B$ may be different even when the gap G between the showerhead surface 232 and either pad $215_A$ or $215_B$ is the same. In an embodiment, the measured voltages can then be correlated to a distance of the gap (e.g., gap $G_1$, gap $G_2$, and gap $G_3$) between the opposing surface (e.g. surface 232 of the showerhead 230) and the first surface 212 of the sensor wafer 210. In an embodiment, the measured voltage may be between 0 V (e.g., when there is no gap between the conductive pad 215 and the showerhead surface 232) and 7V (e.g., when the gap between the conductive pad 215 and the showerhead surface 232 is at the maximum sensing distance).

In an embodiment, the control module 240 may also include other components. For example, the control module 240 may include one or more of a processor, a memory, and a wireless communication module (e.g., Bluetooth or WiFi). The inclusion of a wireless communication module may allow for measurements to be made and transferred to an external device that controls the positioning of the support surface 120 relative to the showerhead 130 and/or otherwise controls the processing tool 100.

As shown, three electric fields 217 are formed (i.e., an electric field is formed between each of the conductive pads $215_A$ and $215_B$ and the showerhead surface 232. Accordingly, the sensor wafer 210 allows for the gap distance G between the sensor wafer 210 and an opposing surface (e.g., a showerhead surface 232) to be made at more than one location. Providing more than one measurement of the gap distance G also allows for a parallelism measurement (i.e., the uniformity of the gap distance G across the surface of the sensor wafer 210) to be determined.

In an embodiment, the maximum sensing range of the sensor wafer 210 may be dependent on the surface areas of the conductive pads 215. In a particular embodiment, the maximum sensing range may be increased by providing first conductive pads $215_A$ that each have a first surface area and a second conductive pad 215 that has a second surface area that is smaller than the first surface area. Providing a second surface area that is smaller than the first surface area improves the signal to noise ratio and provides an increased maximum sensing range. As noted above, the sensing range is improved because the larger pads provide a first voltage and the smaller pads provide a second voltage. The two different voltage measurements allow for noise to be canceled and results in an overall increase in the maximum sensing range. In an embodiment, the second surface area may be at least 5% smaller than the first surface area. In an embodiment, the second surface area may be at least 10% smaller than the first surface area. In an embodiment, the second surface area may be at least 20% smaller than the first area. Such embodiments may provide a sensing range that is approximately 1.0 inch or greater, 1.25 inches or greater, or 1.5 inches or greater. In some embodiments, the accuracy of the measurements may be at least +/−0.0010 inches, or at least +/−0.0005 inches.

In FIGS. 2A and 2B, the first conductive pads $215_A$ are arranged in an alternating pattern with the second conductive pad $215_B$. For example, the conductive pads $215_A$ and $215_B$ are linearly arrange across the surface 212 of the sensor wafer 210 with the first conductive pads $215_A$ being positioned proximate to the edges of the sensor wafer 210 and the second conductive pad $215_B$ being formed in the center of the sensor wafer 210 between the two first conductive pads $215_A$. However, it is to be appreciated that other arrangements and/or numbers of conductive pads $215_A$ and $215_B$ may be implemented, so long as the conductive pads $215_A$ and $215_B$ are formed in an alternating pattern.

As shown in FIG. 2A, the first and second conductive pads $215_A$ and $215_B$ are shown as having substantially circular surface areas. However, it is to be appreciated that embodiments are not limited to such configurations. For example, the conductive pads $215_A$ and $215_B$ may have rectangular or any other polygon shape, a polygon with rounded corners, or any other desired shape. In an embodiment, the first conductive pads $215_A$ are shown as having the same type of shape as the second conductive pad $215_B$ (i.e., the first conductive pads $215_A$ and the second conductive pads $215_B$ are both circular shaped). However, it is to be appreciated that embodiments may also include first conductive pads $215_A$ that do not have the same type of shape as the second conductive pad $215_B$.

Figure 3:
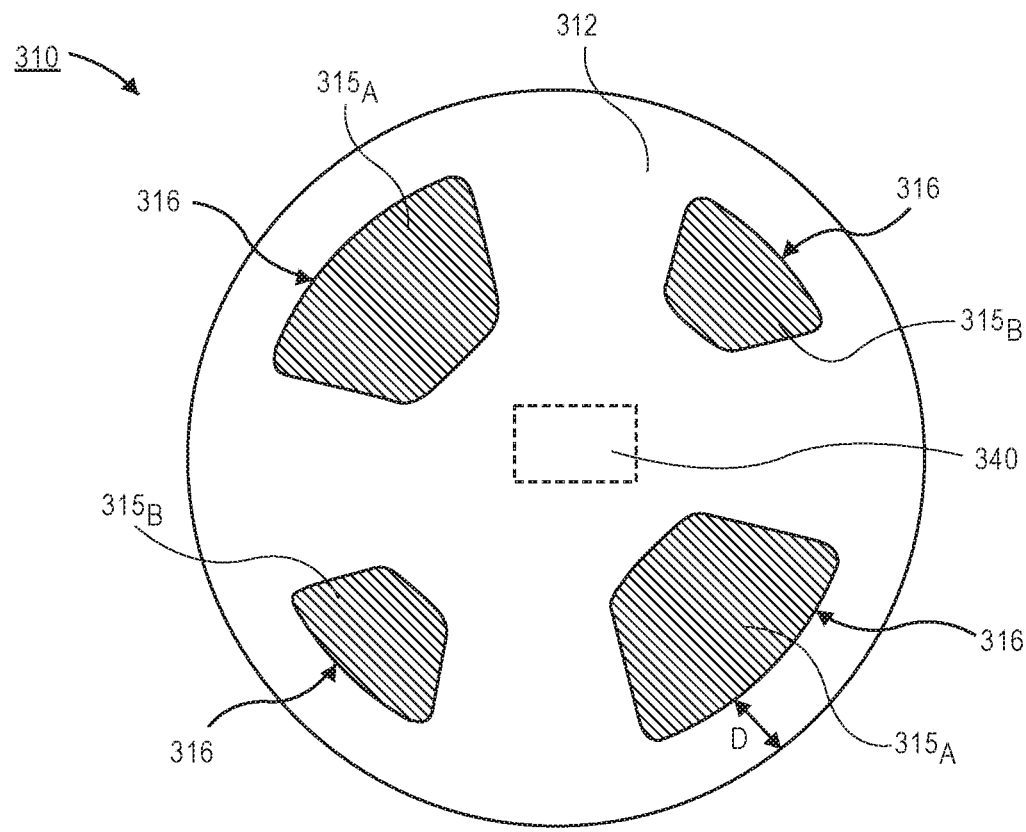
FIG. 3 is a plan view illustration of a sensor wafer with alternating first and second conductive pads arranged radially around the sensor wafer substrate, in accordance with an embodiment.

Referring now to FIG. 3, a plan view illustration of a sensor wafer 310 with a plurality of first conductive pads $315_A$ and a plurality of second conductive pads $315_B$ is shown in accordance with an embodiment. In an embodiment, the first conductive pads $315_A$ and the second conductive pads $315_B$ are arranged radially around the perimeter of the sensor wafer 310 in an alternating pattern. In the illustrated embodiment, there are four electric fields provided (i.e., each first conductive pad $315_A$ forms an electric field with both of the second conductive pads 315). As such, additional gap distance G measurements may be obtained to provide an even more accurate parallelism measurement.

As shown in FIG. 3, the first and second conductive pads $315_A$ and $315_B$ have trapezoidal shapes. The trapezoidal shapes may comprise rounded corners. Additionally, the edge 316 closest to the edge of the surface 312 of the sensor wafer 310 may be curved. For example, the curved edge 316 may match the curve of the edge of the surface 312. Such an embodiment may ensure a uniform spacing between the edge of the surface 312 and the edge 316 of the conductive pads $312_A$ and $312_B$.

In an embodiment, the spacing D between the edge of the surface 312 and the edge 316 of the conductive pads $312_A$ and $312_B$ may be greater than the maximum sensing distance. A spacing D greater than the maximum sensing distance ensures that the edge of the sensor wafer 310 is not erroneously sensed during the measurement of the gap G. For example, the distance D may be approximately 1.0 inch or greater, 1.25 inches or greater, or 1.5 inches or greater.

In an embodiment, the axial arrangement of the conductive pads $315_A$ and $315_B$ may also provide a space in the central portion of the sensor wafer 310 for the control module 340. However, it is to be appreciated that the control module 340 may be located at any convenient location of the sensor wafer 310.

Figure 4:
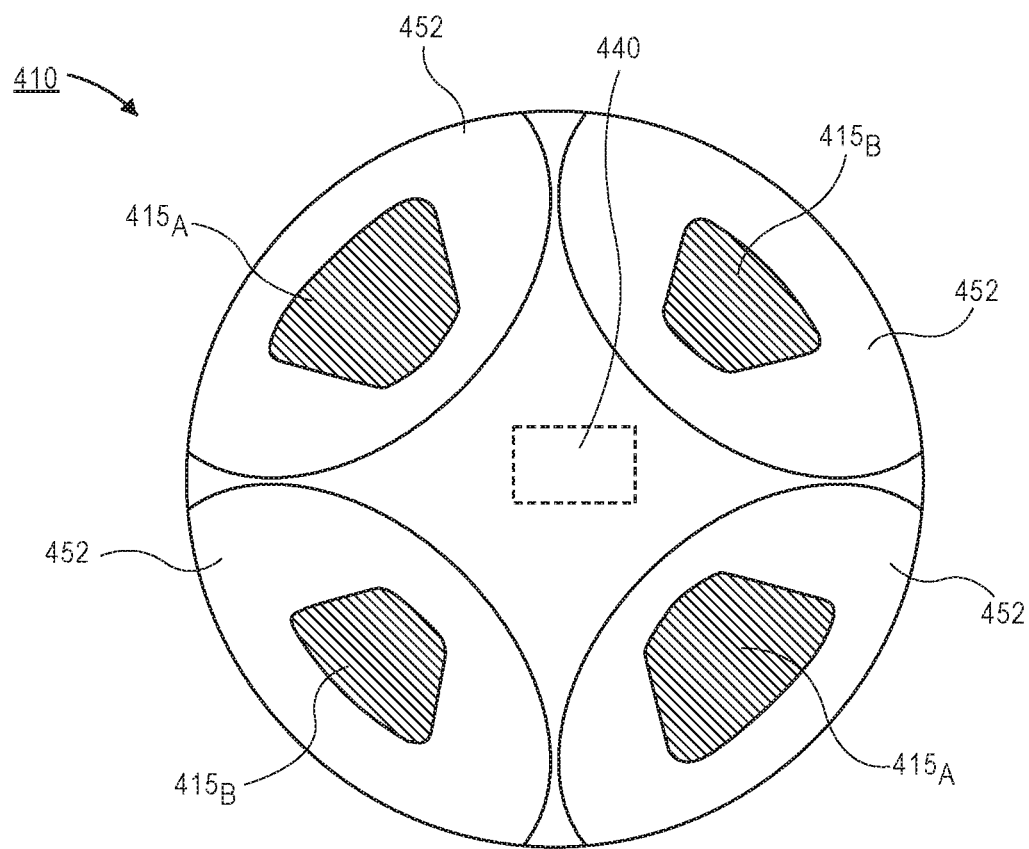
FIG. 4 is a plan view illustration of a sensor wafer with alternating first and second conductive pads and electric field guards around the conductive pads, in accordance with an embodiment.

Referring now to FIG. 4, a plan view illustration of a sensor wafer 410 with electric field guards 452 is shown, in accordance with an embodiment. In an embodiment, an electric field guard 452 may surround each of the conductive pads 415. The electric field guards 452 may limit the lateral spread of the electric field used for sensing the gap G. Accordingly, the electric field is focused vertically away from the surface of the sensor wafer and increases the maximum sensing distance. The electric field guards 452 may comprise a conductive material that is coupled to circuitry in the control module 440. The control module 440 may include an active signal output that is driven at the same voltage potential supplied to the conductive pads 415A and 415e so there is no potential difference between the electric field guards 452 and the conductive pads 415. As such, any external interference (i.e., other than the intended target such as the showerhead) will couple to the electric field guards 452 with minimal interaction with the conductive pads 415.

Figure 5:
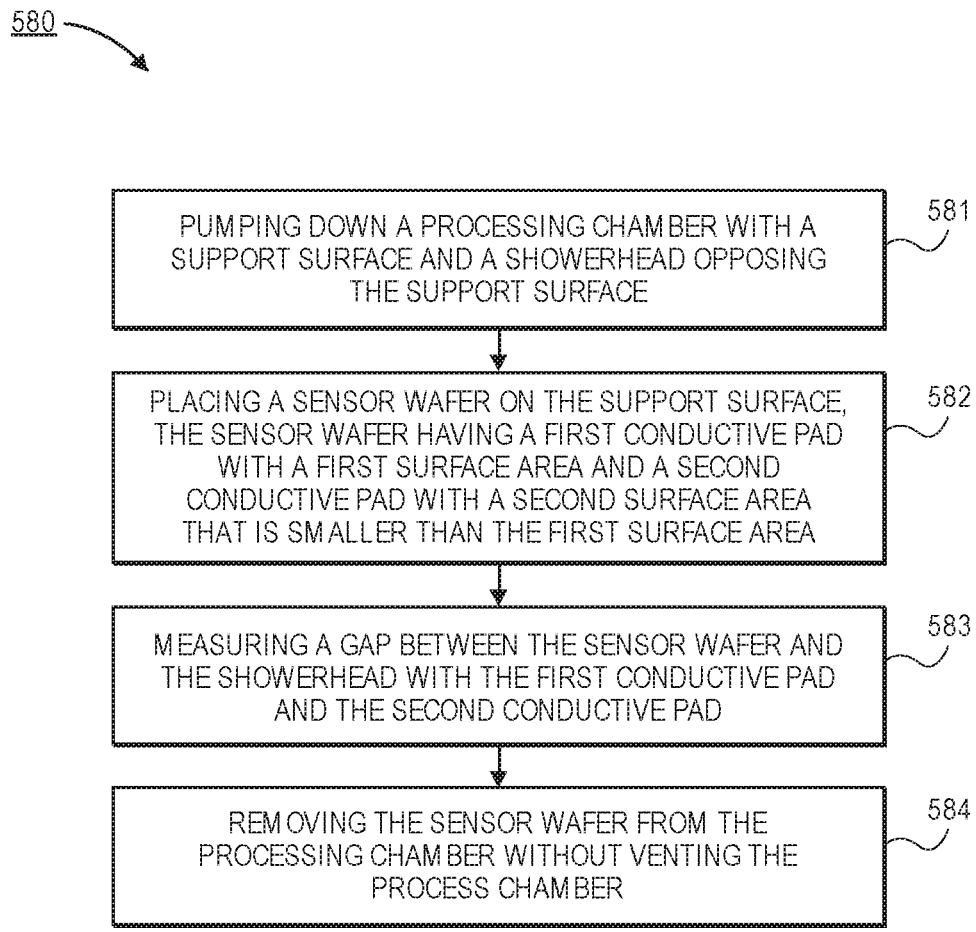
FIG. 5 is a process flow diagram of processing operations used to measure the gap between a showerhead and a support surface, in accordance with an embodiment.

Referring now to FIG. 5, a flow chart of a process 580 for using a sensor wafer to measure the gap distance between the support surface and the showerhead in a processing tool is shown, in accordance with an embodiment.

In an embodiment, process 580 may begin with operation 581 which comprises pumping down a processing chamber with a support surface and a showerhead opposing the support surface. In an embodiment, the processing chamber may be pumped down with a vacuum pump, as is known in the art. The pressure inside the processing chamber may be below atmospheric pressure. For example, the pressure inside the processing chamber may be the pressure used to process substrates in the processing chamber.

In an embodiment, process 580 may then proceed with operation 582 which comprises placing a sensor wafer on the support surface. In an embodiment, the sensor wafer may be placed onto the support surface with a wafer handling robot. For example, the sensor wafer may have dimensions of a typical substrate processed in the processing chamber (e.g., 300 mm diameter), and is able to be moved throughout the processing chamber while the processing chamber remains in a pumped down (i.e., below atmospheric pressure) state.

In an embodiment, the sensor wafer may be a sensor wafer in accordance with embodiments disclosed herein. For example, the sensor wafer may have a first conductive pad with a first surface area and a second conductive pad with a second surface area that is smaller than the first surface area. In a particular embodiment, the sensor wafer may comprise at least two first conductive pads and a second conductive pad arranged in an alternating pattern (e.g., similar to the sensor wafer 210 described with respect to FIG. 2A). In an additional embodiment, the sensor wafer may comprise a plurality of first conductive pads and a plurality of second conductive pads arranged radially in an alternating pattern (e.g., similar to the sensor wafer 310 described with respect to FIG. 3). In yet another embodiment, the sensor wafer may comprise a plurality of electric field guards around each of the first and second conductive pads (e.g., similar to the sensor wafer 410 described with respect to FIG. 4).

In an embodiment, the first and second conductive pads may be electrically coupled to a control module. The control module may include circuitry for supplying current to the conductive pads. The current of the first conductive pads may have an output phase that is 180 degrees offset from an output phase of the second conductive pads.

In an embodiment, process 580 may then continue with operation 583 which comprises measuring a gap between the sensor wafer and the showerhead with the first conductive pad and the second conductive pad. In an embodiment, the control module may sense a voltage difference between the first conductive pad and the second conductive pad. The voltage difference may then be converted into a position measurement of the showerhead with respect to the sensor wafer.

As noted above, sensor wafers in accordance with embodiments disclosed herein allow for gap distances that are greater than 1.0 inch to be measured with the sensor wafer. For example, the sensor wafer may have a maximum sensing distance that is greater than 1.0 inch, greater than 1.25 inches, or greater than 1.5 inches. Accordingly, typical gaps between the showerhead and the support surface needed for processing substrates may be measured with only the sensor wafer. Since no additional equipment is needed in the processing tool (and because the sensor wafer has a form-factor that can be manipulated by the wafer handling robot and pass through existing load locks), embodiments allow for calibration of the processing tool without needing to vent the processing chamber.

In an embodiment, the sensor wafer may provide one or more measurements of the gap between the sensor wafer and the showerhead. That is, in some embodiments, a plurality of gap measurements may be made substantially at the same time to provide a parallelism measurement between the showerhead and the support surface.

In an embodiment, process 580 may then continue with operation 584 which comprises removing the sensor wafer from the processing chamber. In an embodiment, a wafer handling robot may be used to remove the sensor wafer from the processing chamber. In a particular embodiment, the sensor wafer may be removed from the processing chamber without needing to vent the processing chamber. As such, the processing chamber may be calibrated (i.e., adjusted to provide a desired gap between the showerhead and the support surface) without needing to vent and re-pump down the processing chamber in order to begin processing substrates.

Figure 6:
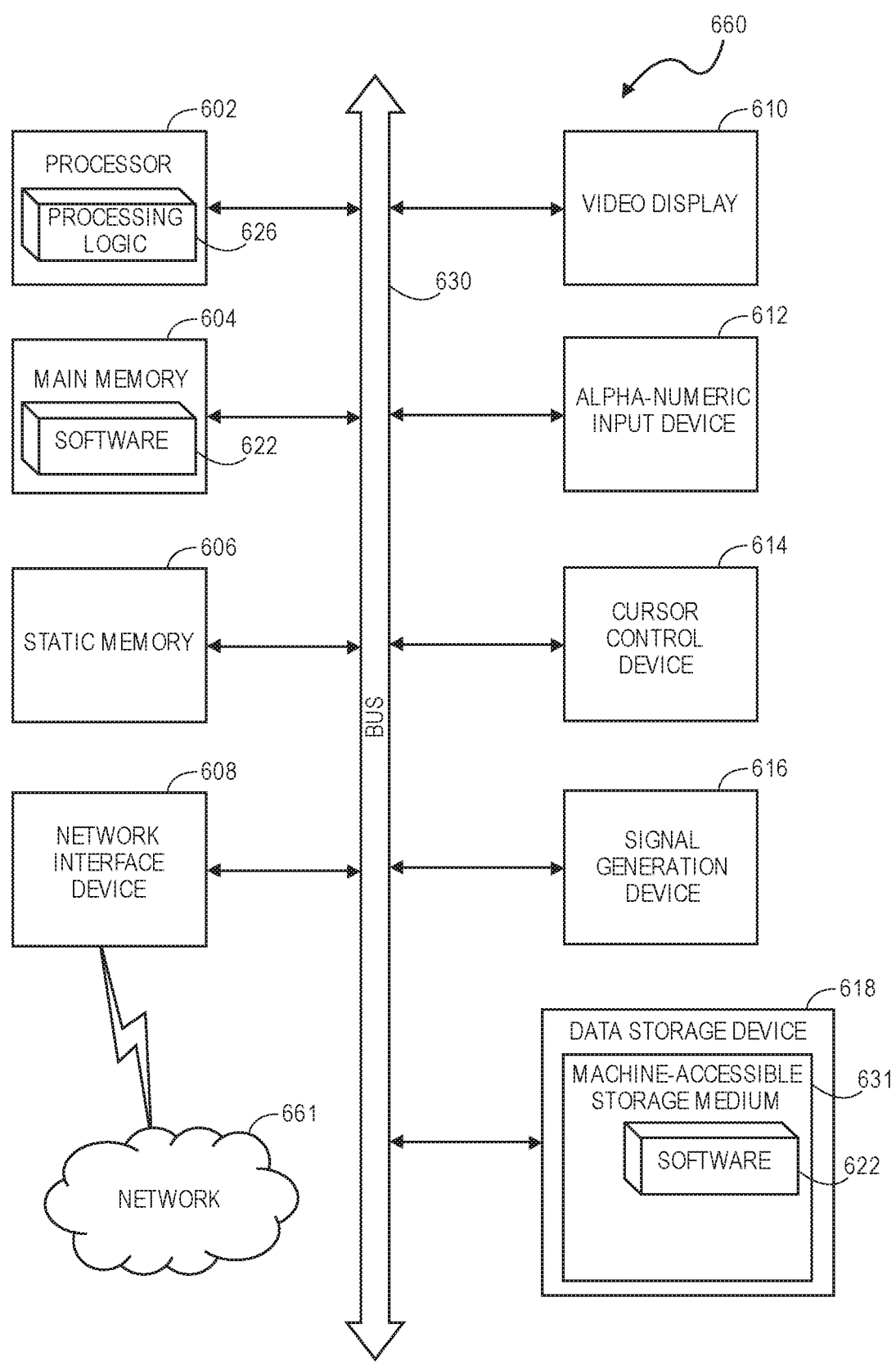
FIG. 6 illustrates a block diagram of an exemplary computer system that may be used in conjunction with processes that include determining the gap between a support surface and a showerhead, in accordance with an embodiment.

Referring now to FIG. 6, a block diagram of an exemplary computer system 660 of a processing tool is illustrated in accordance with an embodiment. In an embodiment, computer system 660 is coupled to and controls processing in the processing tool and/or calibration measurements of the processing tool with a sensor wafer. Computer system 660 may be connected (e.g., networked) to other machines in a network 661 (e.g., a Local Area Network (LAN), an intranet, an extranet, or the Internet). Computer system 660 may operate in the capacity of a server or a client machine in a client-server network environment, or as a peer machine in a peer-to-peer (or distributed) network environment. Computer system 660 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 660, the term "machine" shall also be taken to include any collection of machines (e.g., computers) that individually or jointly execute a set (or multiple sets) of instructions to perform any one or more of the methodologies described herein.

Computer system 660 may include a computer program product, or software 622, having a non-transitory machine-readable medium having stored thereon instructions, which may be used to program computer system 660 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 660 includes a system processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

System processor 602 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 602 may also be one or more special-purpose processing devices such as an application specific integrated circuit (ASIC), a field programmable gate array (FPGA), a digital signal system processor (DSP), network system processor, or the like. System processor 602 is configured to execute the processing logic 626 for performing the operations described herein.

The computer system 660 may further include a system network interface device 608 for communicating with other devices or machines. The computer system 660 may also include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium 631 (or more specifically a computer-readable storage medium) on which is stored one or more sets of instructions (e.g., software 622) embodying any one or more of the methodologies or functions described herein. The software 622 may also reside, completely or at least partially, within the main memory 604 and/or within the system processor 602 during execution thereof by the computer system 660, the main memory 604 and the system processor 602 also constituting machine-readable storage media. The software 622 may further be transmitted or received over a network 661 via the system network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A sensor wafer, comprising:
   a substrate, wherein the substrate comprises a first surface and a second surface opposite the first surface;
   a first conductive pad with a first surface area, wherein the first conductive pad has a surface that is substantially coplanar with the first surface of the substrate, and wherein an edge of the first conductive pad that faces an edge of the substrate has a curvature that matches a curvature of the substrate; and
   a second conductive pad with a second surface area that is smaller than the first surface area, wherein the second conductive pad has a surface that is substantially coplanar with the first surface of the substrate, and wherein an edge of the second conductive pad that faces an edge of the substrate has a curvature that matches the curvature of the substrate.

2. The sensor wafer of claim 1, wherein the second surface area is at least 5% smaller than the first surface area.

3. The sensor wafer of claim 1, further comprising:
   a plurality of first conductive pads; and
   a plurality of second conductive pads.

4. The sensor wafer of claim 3, wherein the first conductive pads and the second conductive pads are arranged in an alternating pattern around a perimeter of the substrate.

5. The sensor wafer of claim 1, further comprising:
   an electric field guard around the perimeters of the first conductive pad and the second conductive pad.

6. The sensor wafer of claim 1, wherein a shortest distance between an edge of the first conductive pad or an edge of the second conductive pad and an edge of the substrate is at least 1 inch.

7. The sensor wafer of claim 1, further comprising:
   a control module embedded in the substrate, wherein the control module comprises circuitry for sensing a distance between the first surface of the substrate and a surface external to the sensor wafer opposing the first surface using the first conductive pad and the second conductive pad.

8. The sensor wafer of claim 7, wherein the circuitry provides an output phase of the first conductive pad that is 180 degrees offset from an output phase of the second conductive pad.

9. The sensor wafer of claim 7, wherein the distance between the first surface of the substrate and a surface external to the sensor wafer is up to 1.5 inches.

10. The sensor wafer of claim 9, wherein an accuracy of the measured distance is at least +/−0.0005 inches.

11. The sensor wafer of claim 7, wherein the control module further comprises a wireless communication module, wherein the wireless communication module transmits measurement data to an external device.

12. A method for measuring a gap between a showerhead and a support surface in a processing chamber, comprising:
   pumping down a processing chamber, wherein the processing chamber comprises a support surface and a showerhead opposing the support surface;
   placing a sensor wafer on the support surface, wherein the sensor wafer comprises a first conductive pad with a first surface area and a second conductive pad with a second surface area that is smaller than the first surface area;
   measuring a gap between the sensor wafer and the showerhead with the first conductive pad and the second conductive pad, wherein measuring the gap comprises providing an output phase to the first conductive pad that is 180 degrees offset from an output phase of the second conductive pad; and
   removing the sensor wafer from the processing chamber without venting the processing chamber.

13. The method of claim 12, wherein the gap between the sensor wafer and the showerhead is greater than 1 inch.

14. The method of claim 13, wherein an accuracy of the measured gap between the sensor wafer and the showerhead is at least +/−0.0005 inches.

15. The method of claim 12, wherein the sensor wafer comprises a plurality of first conductive pads and a plurality of second conductive pads.

16. The method of claim 15, wherein the gap between the showerhead and the sensor wafer is measured in a plurality of locations to provide a parallelism measurement.

17. A sensor wafer, comprising:
- a substrate, wherein the substrate comprises a first surface and a second surface opposite the first surface;
- a plurality of first conductive pads with a first surface area, wherein the first conductive pads have surfaces that are substantially coplanar with the first surface of the substrate;
- a plurality of second conductive pads with a second surface area that is smaller than the first surface area, wherein the second conductive pads have surfaces that are substantially coplanar with the first surface of the substrate, wherein the first conductive pads and second conductive pads are arranged radially around the substrate in an alternating pattern, and wherein outer edges of the first conductive pads and outer edges of the second conductive pads are equidistant from an edge of the substrate; and
- a control module embedded in the substrate, wherein the control module comprises circuitry for sensing a distance between the first surface of the substrate and a surface external to the sensor wafer opposing the first surface using the first conductive pads and the second conductive pads.

18. The sensor wafer of claim 17, wherein the circuitry provides an output phase of the first conductive pads that is 180 degrees offset from an output phase of the second conductive pads.

19. The sensor wafer of claim 17, wherein the distance between the first surface of the substrate and a surface external to the sensor wafer is up to 1.5 inches.

* * * * *